United States Patent [19]

Berlin et al.

[11] 4,246,336

[45] Jan. 20, 1981

[54] LIQUID PHOTOPOLYMERIZABLE COMPOSITION FOR MAKING PRINTING FORMS

[76] Inventors: Alfred A. Berlin, Leninsky prospekt, 57, kv. 9; Fedor I. Dubrovitsky, Vorobievskoe shosse, 2-b, kv. 12, both of Moscow; Eduard T. Lazarenko, ulitsa K. Libknekhta, 2, kv. 13, Lvov; Tamara Y. Kefeli, ulitsa Krasnoprudnaya, 22/24, kv. 103, Moscow; Khaim-Mordke A. Brikenshtein, Noginsky raion, p/o Chernogolovka, ulitsa Vtoraya, 5, kv. 1, Moskovskaya; Vladislav V. Bernatsek, ulitsa Shishkina, 20, kv. 4, Lvov; Tatyana A. Zhizhileva, ulitsa Kirovogradskaya, 16, korpus, 1, kv. 414, Moscow; Boris V. Kovalenko, ulitsa Ushakova, 11, kv. 3, Lvov; Natalya L. Marshavina, prospekt Vernadskogo, 95, korpus 2, kv. 252, Moscow; Roman I. Mervinsky, ulitsa Krivonosa, 29, kv. 5a, Lvov; Anna A. Radugina, Noginsky raion, p/o Chernogolovka, ulitsa Pervaya, 32, kv. 59, Moskovskaya; Anatoly R. Tischenko, ulitsa Furmanova, 14, kv. 10, Lvov; Julia M. Fillipovskaya, ulitsa Molodogvardeiskaya, 22, korpus 1, kv. 16, Moscow, all of U.S.S.R.

[21] Appl. No.: 19,749

[22] Filed: Mar. 12, 1979

[51] Int. Cl.$^3$ .............................................. G03C 1/68
[52] U.S. Cl. .................................... 430/288; 430/281
[58] Field of Search ................. 96/115 P; 204/159.14, 204/159.23, 159.22, 159.19; 260/463; 430/288, 281

[56] References Cited

U.S. PATENT DOCUMENTS

| | | | |
|---|---|---|---|
| 3,716,571 | 2/1973 | Berlin et al. | 260/463 |
| 3,748,133 | 7/1973 | Noonan et al. | 96/115 P |
| 4,157,261 | 6/1979 | Takeda | 96/115 P |

OTHER PUBLICATIONS

USSR Inventor's Certificate No. 255,773, Official Bulletin No. 33, 1969.

*Primary Examiner*—Won H. Louie, Jr.
*Attorney, Agent, or Firm*—Lackenbach, Lilling & Siegel

[57] ABSTRACT

A liquid photopolymerizable composition, according to the invention, consists of methyl methacrylate, benzoin or benzoin ethers, a photopolymerizable component—an oligocarbonate methacrylate or a mixture thereof with an oligoester acrylate or oligoester maleinate at a weight ratio of these oligomers in the mixture of 1:1, the components being taken in the following proportions (in % by weight):
methyl methacrylate: 5-10
benzoin or benzoin ethers: 0.1.0
photopolymerizable component: the balance Light sensitivity of this composition is up to 981 J/m$^2$ in terms of exposure H at d=1 mm (wherein d is the thickness of a photopolymeric layer obtained by acting with UV-radiation on the composition; the radiation source - luminescent UV-lamps of 80 W total output. Printing forms made on the basis of this composition exhibit improved physical and mechanical properties. Thus, tensile strength of the printing forms is as high as 5.25 kgf/mm$^2$ and durability, up to 1 million impressions.

9 Claims, No Drawings

LIQUID PHOTOPOLYMERIZABLE COMPOSITION FOR MAKING PRINTING FORMS

FIELD OF THE ART

The invention relates to liquid photopolymerizable compositions to be used in the polygraphic industry for making printing forms for relief printing on flat-bed and rotary presses, as well as for making printing forms for offset type, offset, flexographic and stencil printing. In addition, these compositions may be used for making plastic products for various uses.

BACKGROUND OF THE INVENTION

Known in the art is a liquid photopolymerizable composition for making printing forms, consisting of methyl methacrylate, benzoin or benzoin ethers and a photopolymerizable component- an oligoester acrylate (cf. USSR Inventor's Certificate No. 255,773, Cl. C 03 c 1/74, Official Bulletin No. 33, 1969).

This liquid photopolymerizable composition enables the preparation of printing forms with satisfactory ink receptivity, flexibility and hardness. The light-sensitivity of the composition is, however, rather low, in terms of exposure H, to 3724 $J/m^2$ at $d=1$ mm, wherein d is the thickness of a photopolymeric layer obtained by acting on the liquid photopolymerizable composition with UV-radiation (a source of radiation-luminescent lamps of 80 W total output). In addition, physical and mechanical properties of printing forms prepared on the basis of such liquid photopolymerizable composition are inadequate and unsatisfactory, e.g. when using the forms for paper printing. Thus, the tensile strength of printing forms is 0.82 $kgf/m^2$ and durability, 200 thousand impressions.

SUMMARY OF THE INVENTION

It is an object of the invention to provide a liquid photopolymerizable composition for making printing forms which exhibits high light sensitivity.

Another object of the invention is to provide a liquid photopolymerizable composition enabling the preparation of printing forms exhibiting improved physical and mechanical properties.

With these and other objects in mind, the invention resides in a liquid photopolymerizable composition for making printing forms, consisting of methyl methacrylate, benzoin or benzoin ethers, a photopolymerizable component, wherein, according to the invention, the photopolymerizable component of the composition comprises an oligocarbonate methacrylate or a mixture thereof with an oligoester acrylate or oligoester maleinate at a weight ratio of the oligomers of 1:1 in the mixture, the components being used in the composition in the following proportions (in % by weight):

methyl methacrylate: 5–10
benzoin or benzoin ethers: 0.5–1.0
oligocarbonate methacrylate or a mixture thereof with an oligoester acrylate or oligoester maleinate: the balance.

Owing to the use, in the composition according to the invention, of the above-described photopolymerizable component, the composition exhibits high transparency and improved light sensitivity in terms of exposure H-981 $J/cm^2$ at $d=1$ mm (the meaning for d as given above; radiation source—luminescent lamps of 80 W total output). Printing forms prepared on the basis of the liquid photopolymerizable composition according to the invention feature improved physical and mechanical properties. Thus, tensile strength of printing forms is as high as 5.25 $kgf/mm^2$, durability is up to 1 million impressions. Moreover, the use of the composition according to the invention enables an improvement in quality of printing forms, specifically, such characteristics as profile of printing elements (angle of 75° at the base of printing element), resolution (up to 120 lines per 1 cm), and distinguishing capacity, that is the ability of reproducing the smallest individual element (to 40 um). Printing forms on the basis of the composition according to the invention exhibit good ink receptivity and separation, resistance to ink solvents and binders. In making printing forms on the basis of the composition according to the invention, nonexposed portions of the form may be removed with aqueous solutions of salts rather than with toxic organic solvents.

DETAILED DESCRIPTION OF THE INVENTION

The liquid photopolymerizable composition according to the invention is prepared by mixing the above-mentioned components in a pre-determinded ratio, at room temperature. The resultant mixture is thoroughly stirred to obtain a homogenous composition, and degassed.

The resultant liquid photopolymerizable composition is used for making printing forms on aluminum, steel or copper supports, plastic supports (vinylplast, triacetate, polyethyleneterephthalate, a support comprising a photopolymeric layer obtained by exposing UV-radiation on a liquid photopolymerizable composition, or a glass fabric support.

When printing forms are made on a steel support, the prepared composition is poured into the space of a forming and print-down frame, formed by a glass with a negative glued thereto, and a magnetic pad to which the steel support is fixed. Then an exposure is effected using UV-lamps. Unexposed portions are removed, e.g. with an aqueous solution of a salt.

When printing forms are made on a support comprising the photopolymeric layer on the basis of the composition according to the invention, the composition is poured into a transluscent space of the forming and print-down frame formed by two glasses, with a negative being fixed to one of the glasses. The exposure is effected simultaneously on both sides of the space (on the negative side and on the support side of the printing form). Nonexposed portions are removed as described above.

Among oligocarbonate methacrylates for the liquid photopolymerizable composition according to the invention, use may be made of e.g. α, ω-bis(methacryloyloxyethyleneoxycarbonyloxyethylene)oxy, α,ω-bis(methacryloyloxyethyleneoxycarbonyloxy)ethylene,α,ω-bis(methacryloyloxyethyle ecarbonyloxy)tetramethylene. Oligocarbonate methacrylates are obtained by a known method of low-temperature nonequilibrium controlled polycondensation (condensation telomerization) in a solution of lower chloroalkanes in the presence of tertiary amines as acceptors of hydrogene chloride released during reaction. For the synthesis of oligocarbonate methacrylates, the use is made of monoethylene glycol methacrylate and bischlorocarbonates of respective glycols. Thus, for the synthesis of α,ω-bis(methacryloyloxyethyleneoxycarbonyloxyethylene)oxy, use is made of monoethylene glycol methacrylate and bischolorocarbonate dietheylene glycol (cf. U.S. Pat. No. 3,716,571, Cl. C 07C 69/54, C 08 G 17/10).

Among oligoester acrylates in the composition according to the invention, taken in a mixture with oligocarbonate methylacrylates, use may be made of e.g. an oligoester acrylate on the basis of methacrylic acid, diethylene glycol and phthalic anhydride with an average degree of polycondensation of 1 or 2, or an oligoester acrylate on the basis of methacrylic acid, triethylene glycol and phthalic anhydride with an average degree of polycondensation of 1 (cf. R. A. Berlin, T. Ya. Kefeli, G. V. Korolev, Polyester Acrylates (in Russian), Moscow, Nauka Publishers, 1967, pp. 55, 60, 88).

Oligoester acrylates are prepared by a known method of condensation telomerization conducted under polycondensation conditions with a shifted equilibrium, in a solution of aromatic hydrocarbons, in the presence of protic catalysts. For the synthesis of polyester acrylates, the use is made of acids of the acrylic series, and a telogene comprises dicarboxylic acids or their anhydrides, glycols or polyols (ibid., p. 63).

Oligoester maleinates used in the liquid photopolymerizable composition, according to the invention, in a mixture with oligocarbonate methacrylates are prepared by polycondensation of glycols, such as diethylene glycol, with phthalic and maleic anhydrides (cf. Handbook of Plastics (in Russian), Moscow, Khimia Publishers, 1969, v. 2, pp. 7,8).

Better understanding of the invention may be had from the following description of specific embodiments given by way of example.

EXAMPLE 1

The following liquid photopolymerizable composition (in % by weight) was prepared:
methyl methacrylate: 10
benzoin: 1
$\alpha,\omega$-bis(methacryloyloxyethyleneoxycarbonyloxyethylene)oxy: 89.

For that purpose, the above-mentioned components were mixed, the resultant mixture was thoroughly stirred to obtain a homogeneous composition, and degassed by allowing the composition to stay at room temperature (18°–22° C.) for 1.5–2 hours.

The resultant composition was poured into the space of a forming and print-down frame, formed by a glass with a negative glued thereto, and a magnetic pad to which a steel support was fixed. The composition was then exposed using luminescent UV-lamps of 80 W total output. Nonexposed portions were removed with 1% aqueous solution of sodium bicarbonate.

The liquid photopolymerizable composition of this Example had light sensitivity of exposure 981 $J/m^2$ in terms H at d=1 mm.

A printing form on the basis of the composition had tensile strength of 5.25 $kgf/cm^2$ and durability of about 1 million impressions. The printing form had the following qualitative characteristics: angle of 75° at the base of printing element, resolution of 120 lines per 1 cm, distinguishing capacity of 40 um.

EXAMPLE 2

The following liquid photopolymerizable composition (in % by weight) was prepared as described in Example 1:
methyl methacrylate: 5
benzoin methylate: 1
$\alpha,\omega$-bis(methacryloyloxyethyleneoxycarbonyloxyethylene)oxy: 47
oligoester acrylate on the basis of methacrylic acid, diethylene glycol and phthalic anhydride with degree of polycondensation of 2: 47.

A printing form on the basis of this composition was made as described in Example 1.

Light sensitivity of the resultant composition was 1310 $J/m^2$ in terms of H at d=1 mm.

The printing form on the basis of this composition had tensile strength of 3.4 $kgf/mm^2$ and durability of 700 thousand impressions.

EXAMPLE 3

The following liquid photopolymerizable composition (in % by weight) was prepared as described in Example 1:
methyl methacrylate: 10
benzoin methylate: 0.5
$\alpha,\omega$-bis(methacryloyloxyethyleneoxycarbonyloxy)ethylene: 44.75
oligoester acrylate on the basis of methacrylic acid, triethylene glycol and phthalic anhydride with an average degree of polycondensation of 1: 44.75

A printing form was made from this composition as described in Example 1.

Light sensitivity of this composition was 1408 $J/m^2$ in terms of exposure H at d=1 mm.

The printing form on the basis of this composition had tensile strength of 3.5 $kgf/mm^2$ and durability of 600 thousand impressions.

EXAMPLE 4

The following liquid photopolymerizable composition (in % by weight) was prepared as described in Example 1:
methyl methacrylate: 7.5
benzoin-iospropylate: 0.75
$\alpha,\omega$-bis(methacryloyloxyethyleneoxycarbonyloxy)tetramethylene: 92.75.

The resultant composition was poured into a translucent space of a forming and print-down frame formed by two glasses, with a negative glued to one of the glasses. The exposure was effected on either side of the spaced simultaneously (on the negative side and on the support side of the printing form using luminescent UV-lamps of 80 W total output. Non-exposed portions were removed with 1% aqueous solution of sodium bicarbonate.

In this embodiment, the support of the printing form comprised a photopolymeric layer prepared by acting with UV-radiation on an identical photopolimerizable liquid composition.

Light sensitivity of this composition was 1090 $J/m^2$ in terms exposure H at d=1 mm.

The printing form based on this composition had tensile strength of 4 $kgf/cm^2$ and durability of up to one million of impressions.

EXAMPLE 5

The following liquid photopolymerizable composition (in % by weight) was prepared as described in Example 1:
methyl methacrylate: 5
benzoin: 0.5
$\alpha,\omega$-bis(methacryloyloxyethyleneoxycarbonyloxyethylene)oxy: 47.25 oligoester acrylate on the basis of methacrylic acid, diethylene glycol and phthalic anhydride with an average degree of polycondensation of 1: 47.25.

A printing form was prepared on the basis of this composition as described in Example 1. Light sensitivity of the composition was 1408 J/m² in terms of exposure H at d=1 mm.

The printing form on the basis of this composition had tensile strength of 3.8 kgf/mm² and durability of 500 thousand impressions.

EXAMPLE 6

The following liquid photopolymerizable composition (in % by weight) was prepared as described in Example 1:
methyl methacrylate: 10
benzoin methylate: 1
α,ω-bix(methacryloyloxyethyleneoxycarbonyloxyethylene)oxy: 44.5
oligoester maleinate which is the products of polycondensation of diethylene glycol with phthalic and maleic anhydrides: 44.5

A printing form on the basis of this composition was prepared as described in Example 1.

Light sensitivity of the composition was 1260 J/m² in terms of exposure H at d=1 mm.

The printing form on the basis of this composition had tensile strength of 3.8 kgf/m² and durability of 800 thousand impressions.

We claim:

1. A liquid photopolymerizable composition for making printing forms, consisting of methyl methacrylate, a compound selected from the group consisting of benzoin and benzoin ethers, and a photopolymerizable component selected from the group consisting of an oligocarbonate methacrylate, a mixture of an oligocarbonate methacrylate and an oligoester acrylate in a weight ratio of 1:1, and a mixture of an oligocarbonate methacrylate and an oligoester maleinate in a weight ratio of 1:1, the above components being taken in the following proportions (in % by weight):
methyl methacrylate: 5-10
compound selected from the group consisting of benzoin and benzoin ethers: 0.5-1.0
photopolymerizable component: the balance.

2. A composition in accordance with claim 1, wherein the photopolymerizable component is an oligocarbonate methacrylate.

3. A composition in accordance with claim 1, wherein the photopolymerizable component is a mixture of an oligocarbonate methacrylate and an oligoester acrylate in a weight ratio of 1:1.

4. A composition in accordance with claim 1, wherein the photopolymerizable component is a mixture of an oligocarbonate methacrylate and an oligoester maleinate in a weight ratio of 1:1.

5. A composition in accordance with any of claims 2, 3 or 4, wherein said oligocarbonate methacrylates are selected from the group consisting of α,ω-bis(methacryloyloxyethyleneoxycarbonyloxyethylene)oxy, α,ω-bis(methacryloyloxyethyleneoxycarbonyloxy)ethylene, and α,ω-bis(methacryloyloxyethylenecarbonyloxy)tetramethylene.

6. A composition in accordance with claim 3, wherein said oligoester acrylate is made on the basis of methacylic acid, diethylene glycol and phthalic anhydride with an average degree of polycondensation of 1.

7. A composition in accordance with claim 3, wherein said oligoester acrylate is made on the basis of methacrylic acid, triethylene glycol and phthalic anhydride with an average degree of polycondensation of 1.

8. A composition in accordance with claim 4, wherein said oligoester maleinates are prepared from the polycondensation of glycols with phthalic and maleic anhydrides.

9. A composition in accordance with claim 8, wherein said glycol is diethylene glycol.

* * * * *